United States Patent

[11] 3,568,097

[72] Inventor Tom M. Hyltin
Dallas, Tex.
[21] Appl. No. 871,677
[22] Filed Nov. 18, 1969
[45] Patented Mar. 2, 1971
[73] Assignee Texas Instruments Incorporated
Dallas, Tex.
Continuation of application Ser. No. 805,900, Mar. 10, 1969, now abandoned, which is a continuation of application Ser. No. 606,425, Dec. 30, 1966, now abandoned.

[54] SWITCHED LINE LENGTH PHASE SHIFT NETWORK FOR STRIP TRANSMISSION LINE
4 Claims, 5 Drawing Figs.

[52] U.S. Cl. .......... 333/7, 307/262, 307/303, 333/31
[51] Int. Cl. .......... H01p 1/10, H01p 1/18
[50] Field of Search .......... 307/253, 256, 259, 262, 303; 330/22, 40; 333/7, 31, 84 (M), 97 (S)

[56] References Cited
UNITED STATES PATENTS

| | | | |
|---|---|---|---|
| 3,027,524 | 3/1962 | May, Jr. | 307/259X |
| 3,244,867 | 4/1966 | Lavin | 307/259X |
| 3,295,138 | 12/1966 | Nelson | 333/31UX |

OTHER REFERENCES

Uhlir, Jr. Microwave Applications of Integrated-Circuit Techniques, Proc. of the IEEE, Dec. 1964 P. 1621 relied on 317-235/22

*Primary Examiner*—Herman K. Saalbach
*Assistant Examiner*—Paul L. Gensler

ABSTRACT: A diode switched line length phase shift network utilizing alternately directed diodes to reduce the number of DC biasing paths required to selectively switch the line length in various combinations into the circuit and the utilization of the low capacitance and high dynamic collector resistance of a transistor to apply a DC bias to the switching diodes of the phase shift circuit.

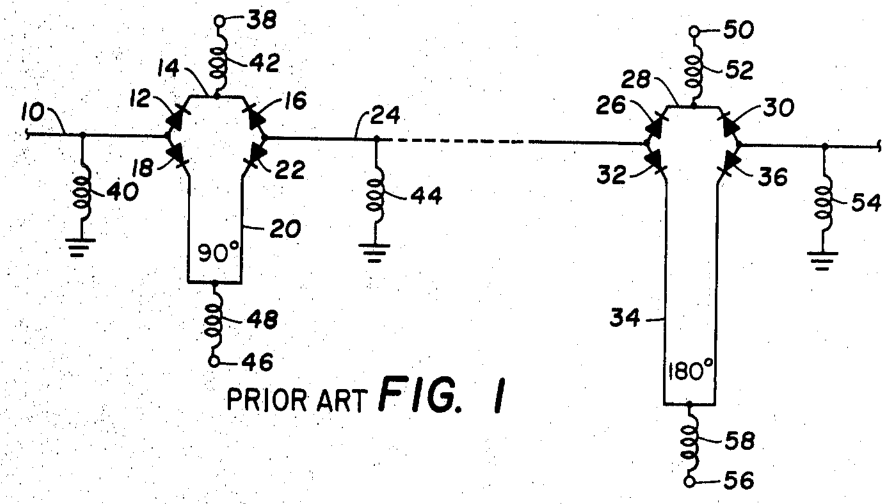
PRIOR ART FIG. 1
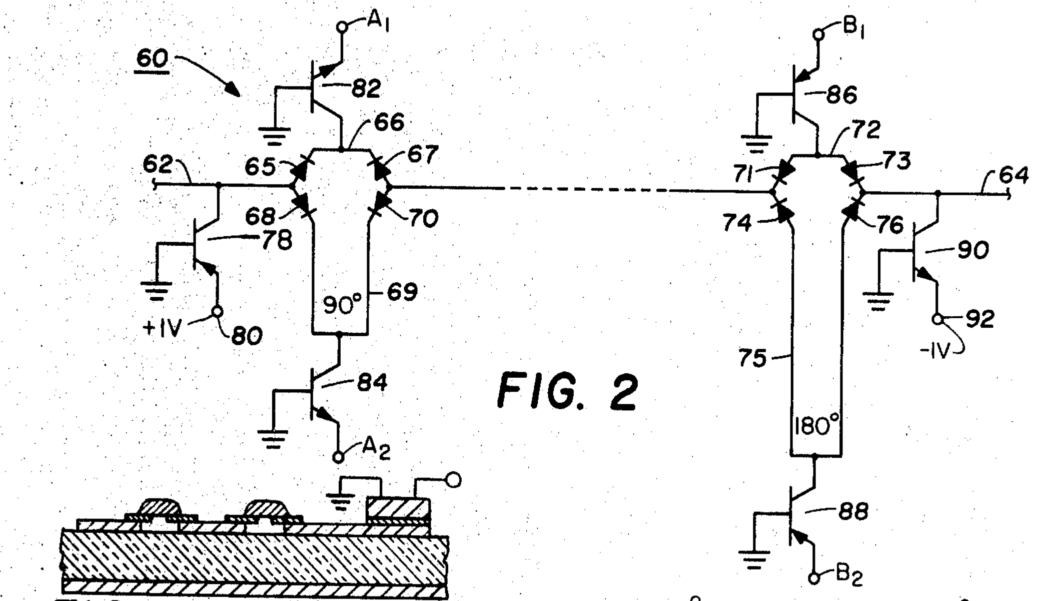
FIG. 2
FIG. 2a HYBRID
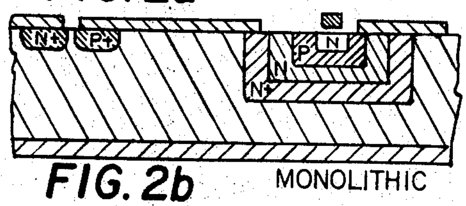
FIG. 2b MONOLITHIC
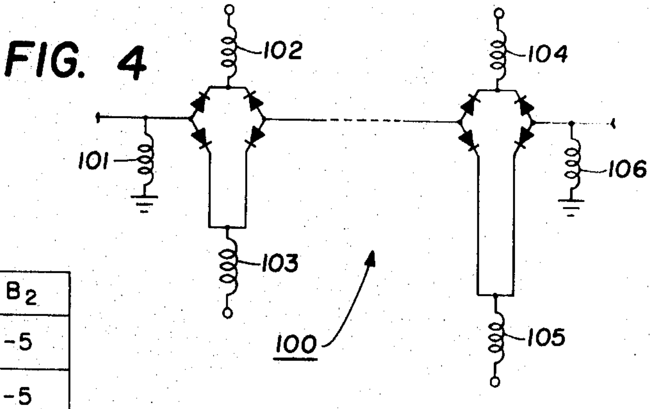
FIG. 4
| | $A_1$ | $A_2$ | $B_1$ | $B_2$ |
|---|---|---|---|---|
| 0° | −5 | +5 | +5 | −5 |
| 90° | +5 | −5 | +5 | −5 |
| 180° | −5 | +5 | −5 | +5 |
| 270° | +5 | −5 | −5 | +5 |
FIG. 3
INVENTOR
TOM M. HYLTIN
E. Mickey Hubbard
ATTORNEY

SWITCHED LINE LENGTH PHASE SHIFT NETWORK FOR STRIP TRANSMISSION LINE

This application is a continuation of application Ser. No. 805,900,filed Mar. 10, 1969 which in turn is a continuation of application Ser. No. 606,425,filed Dec. 30, 1966 both abandoned.

BACKGROUND OF THE INVENTION

This invention relates generally to microwave systems, and more particularly relates to miniaturized circuits utilizing strip transmission lines and semiconductor components which require the introduction of DC bias levels without interfering with the microwave transmission properties of the system.

Considerable effort has been devoted to the perfection of microminiaturized microwave function blocks, especially in the radar field. The first step was the replacement of vacuum tubes with discrete semiconductor devices on printed circuits. Hybrid circuits were then developed in which discrete, non-packaged semiconductor devices were mated with stripline circuits formed on the surface of ceramic or other insulating substrates. More recently, circuits for microwave frequency operation have been developed in which a monolithic semiconductor slice serves as the substrate into which the semiconductor components are formed by diffusion or other techniques. Strip transmission lines are formed on the surface of the semiconductor substrate to interconnect the semiconductor components and to perform various circuit functions.

In each of these cases, the accepted practice for introducing a DC bias to microwave strip transmission line is through a quarter wavelength choke formed by a high impedance strip line. In many circuits these strip lines occupy more space on the substrate than do the active portions of the circuit and therefore constitute a significant limitation upon the ultimate degree of miniaturization which could be achieved for a particular frequency of operation. This is dramatically represented in a simple line length phase shifter in which only slightly more than one wavelength of strip line is required to achieve a 360° phase shift, yet $4n—2$ quarter wavelength chokes are required for a phase shifter having $n$ stages in order to apply the DC bias voltages necessary to operate the switching diodes.

SUMMARY OF INVENTION CLAIMED

The method of applying a DC bias to a strip transmission line which comprises passing the DC bias current through the collector-emitter circuit of a transistor while utilizing the high collector dynamic resistance and low collector capacitance of the transistor for microwave isolation. The method of selectively biasing the switching diodes of a switch line length phase shift network which comprises selectively forward biasing the diodes of two adjacent stages through the same DC bias circuit.

The diode switched line length phase shift network wherein the adjacent switching diodes of adjacent phase shift stages are oriented in the same direction and a single DC input terminal is connected to each pair of switching diodes associated with each line length through the emitter-collector circuit of a transistor. The number of quarter wavelength chokes required to bias the diodes in a switched line length phase shift network can thus be eliminated or reduced to provide a smaller circuit.

BRIEF DESCRIPTION OF THE DRAWINGS

FIG. 1 is a schematic circuit diagram of a conventional diode switched line length phase shifter;

FIG. 2 is a schematic circuit diagram of a line length phase shift network in accordance with the present invention;

FIGS. 2 *a* and 2 *b* are partial sectional views of a circuit such as that illustrated schematically in FIG. 2 in hybrid and monolithic integrated circuit form respectively;

FIG. 3 is a table which serves to illustrate the operation of the circuit of FIG. 2; and FIG. 4 is a schematic circuit diagram of another line length phase shift network in accordance with this invention.

DESCRIPTION OF THE PREFERRED EMBODIMENTS

Referring now to the drawings, a conventional switched line length phase shift network is shown in FIG. 1. Microwave energy applied to strip transmission line 10 may pass through either a zero phase shift path comprised of diode 12, strip line 14 and diode 16, or through a phase shift path including diode 18, strip transmission line 20 and diode 22. The path including strip line 20 is longer than the path including strip line 14 so that the phase of a signal directed through strip line 20 will be delayed when compared to a signal passed through strip line 14 by a phase equal to the difference in the lengths of the lines.

In order to simplify the discussion of the phase shift network of FIG. 1, assume that the path including strip line 20 is 90° longer than the path including strip line 14. The first stage of the shifter will then be produce a 90° phase shift when switched into the circuit. The microwave energy then passes through a strip line 24 to any number of successive phase shift stages each of which may introduce as many additional degrees of phase shift as desired. For purposes of illustration, however, assume that the energy passes into a second phase shift stage having a zero phase shift path including diode 26, strip line 28 and diode 30, and a 180° phase shift path including diode 32, strip line 34, and diode 36.

The microwave energy is selectively switched though the alternate paths by selectively forward biasing the various diodes to switch the diodes "on." Diodes 12 and 26 may be selectively switched "On" by making terminal 38 negative with respect to ground. Current then flows through a quarter wavelength strip line choke 40, diode 12 and a quarter wavelength strip line choke 42 to terminal 38 and from ground through quarter wavelength strip line choke 44, diode 16 and choke 42 to terminal 38. Diodes 18 and 22 can be turned "on" by making terminal negative with respect to ground so that current flows from ground through chokes 40 and 44 and diodes 18 and 22, respectively, through quarter wavelength choke 48 to terminal 46. Similarly, diodes 26 and 30 may be forward biased "on" by applying a negative potential to terminal 50, in which case current passes through choke 44, diode 26 and quarter wavelength choke 52 and through quarter wavelength choke 54, diode 30 and choke 52. Diodes 32 and 36 can be turned "on" by making terminal 56 negative with respect to ground.

It will be noted that for a phase shift network having $n$ stages, the number of quarter wavelength chokes required to switch the diodes is $4n—1$,yet only slightly more than 360° of strip line is required to achieve 360° of phase shift, regardless of the number of stages. As the number of phase shift stages $n$ increases, the total strip line length required for the quarter wavelength chokes used to inject the DC bias becomes very high and occupies a major portion of the total space required for the phase shift network.

Referring now to FIG. 2, a phase shift circuit constructed in accordance with the present invention is indicated generally by the reference numeral 60. The circuit 60 is also illustrated as comprising a 90° phase shift stage and a 180° phase shift stage, although it will be understood that any number of phase shift stages desired may be used. The circuit 60 may be considered as having an input 62 and an output 64. The 90° phase shift stage has a zero length path including diode 65, strip line 66 and diode 67, and a 90° phase shift path including diode 68, strip line 69 and diode 70. Similarly, the 180° phase shift stage includes a zero phase path including diode 71, strip line 72 and diode 73, and a 180° phase shift path including diode 74, strip line 75, and diode 76.

A DC voltage path is provided at the input 62 by the emitter-collector circuit of transistor 78, the collector being connected to strip line 62, the base being grounded, and the emitter being connected to a DC supply terminal 80. Similarly the collector of transistor 82 is connected to strip line 66, the base is connected to ground, and the emitter is connected to a voltage control terminal $A_1$. The collector of a transistor 84 is connected to the strip line 69, the base is grounded and the emitter is connected to a DC control terminal $A_2$. The collector of transistor 86 is connected to strip line 72, the base is grounded and the emitter is connected to DC control terminal $B_1$. The collector of transistor 88 is connected to strip line 75, the base is grounded and the emitter is connected to DC control terminal $B_2$. The collector of transistor 90 is connected to the output strip line 64, the base is grounded and the emitter is connected to a DC control terminal 92. In accordance with an important aspect of this invention, the circuit 60 is fabricated in either hybrid or integrated circuit form using conventional and known techniques so that the transistors are mated directly to the strip transmission lines without being packaged in the customary manner.

In the operation of the circuit 60, diode 65 can be selectively forward biased by current flowing from terminal 80 through transistor 78, through diode 65 and through transistor 82 to terminal $A_1$, and diode 68 can be forward biased by current from terminal 80 through diode 68 and transistor 84 to terminal $A_2$. Diodes 67 and 70 may be forward biased either by current from terminals $B_1$ and $B_2$ through transistors 86 and 88, and diodes 71 or 74 and through transistors 82 and 84 to terminals $A_1$ and $A_2$. Diode 71 can be forward biased from terminal $B_1$ through either diode 67 and transistor 82 to terminal $A_1$, or through diode 70 and transistor 84 to terminal $A_2$. Similarly, diode 74 can be forward biased by current from terminal $B_2$ through transistor 88 and through either diode 67 to terminal $A_1$ or through diode 70 to terminal $A_2$. Diode 73 can be forward biased by current from terminal $B_1$ through transistor 86 and transistor 90 to terminal 92, and diode 76 can be forward biased by current from terminal $B_2$ through transistor 88 and transistor 90 to terminal 92.

Thus, the microwave energy may be switched to the zero length transmission line 66 in preference to the 90° phase shift line 69 by making terminal $A_1$ negative with respect to terminal 80 and with respect to either terminal $B_1$ or $B_2$, while making terminal $A_2$ positive with respect to terminal 80 and at least as positive as both terminals $B_1$ and $B_2$. The microwave energy may be switched through the 90° phase shift line 66 by reversing the relationship of terminals $A_1$ and $A_2$ in respect to terminals 80, $B_1$ and $B_2$. The same procedure is applicable to operate the 180° phase. Thus, by maintaining terminal 80 at +1 volt and terminal 92 at −1 volt, the various degrees of phase shift 0, 90, 180 and 270 can be achieved by applying the voltage levels indicated in the table shown in FIG. 3 to the respective terminals $A_1$, $A_2$, $B_1$ and $B_2$.

The circuit 60 of FIG. 2 illustrates the method of this invention wherein the DC biased potential and currents are applied to the strip transmission lines through the emitter-collector circuit of a transistor. Thus, it will be noted that all quarter wavelength chokes have been eliminated. The manner in which the diodes, transistors and striplines are provided in hybrid and integrated circuit form respectively is illustrated in the partial sectional views of a portion of the circuit 60 shown in FIGS. *2a* and *2b*. Each transistor provides a path for DC biasing current, yet the high dynamic resistance of the collector of the transistor, together with the very low capacitance of the collector junction effectively isolates the microwave energy from the DC supply sources connected to the various DC terminals. The dynamic collector resistance of transistors currently used may be between 1,000 and 30,000 ohms and, therefore, can be used at frequencies of several thousand megacycles without significantly loading a 50 ohm transmission line. Thus, any discontinuity presented by the transistors is so large that it has no effect upon the energy transferred through the transmission line. An unpackaged transistor, that is, one incorporated in either a hybrid or an integrated circuit, has a very small collector capacitance, usually less than 0.1 pico-farad so that very little microwave energy is lost through each of the transistors.

The circuit 60 also has a reduced number of DC bias circuits because of the orientation of the switching diodes. It will be noted that the diodes of each stage are oriented in the same direction as the adjacent diodes of the adjacent stage so that the DC current path for each diode extends through the diodes of the adjacent stage. By reason of the novel arrangement of the switching diodes, the DC biasing paths between each adjacent stage of the phase shift circuit, such as that provided by choke 44 in FIG. 1, can be eliminated.

The phase shift circuit 100 in FIG. 4 illustrates this aspect of the invention more clearly. The phase shift circuit 100 is identical to the phase shift circuit 60 except that transistors 78, 82, 84, 86, 88 and 90 have been replaced by quarter wavelength chokes 101—106 respectively. Thus, in a phase shift circuit having $n$ phase shift stages, the number of quarter wavelength chokes required is reduced from $4n+1$ to $2n+2$ which is a very significant reduction as the number of phase shift stages $n$ increases.

Although preferred embodiments of the invention have been described in detail, it is to be understood that various changes, substitutions and alterations can be made therein without departing from the spirit and scope of the invention as defined by the appended claims.

I claim:

1. A switched line length phase shift network for a microwave strip transmission line comprising at least first and second succeeding phase shift stages in series in microwave strip transmission line;

said first and second phase shift stages each comprising a zero phase shift transmission line path, a predetermined phase shift transmission line path connected in parallel with said zero phase shift transmission line path, and a pair of opposed diodes connected in each of said transmission line paths, said diodes presenting a high impedance to the transmission of said microwave energy when in their nonconducting state;

the paris of diodes of said first phase shift stage connected to said transmission line and being of the opposite polarity relative to the polarity of the paris of diodes of the second succeeding stage.

selectively energized DC bias means connected to each transmission line path between each said pair of opposed diodes for rendering said diodes selectively conductive to permit the transmission of microwave energy therethrough, the ground for said DC bias means to one of said stages being provided through a diode of the other of said stages; and isolating means for limiting loss of microwave energy from said transmission line through said DC bias means, said isolating means comprising transistors having collector, base and emitter electrodes with the collector connected to the respective transmission line path, the base connected to a reference voltage and the emitter connected to the DC bias means.

2. The switched line length phase shift network defined in claim 1 wherein the transmission lines comprise strip transmission lines and the body of the transistor is connected directly to the strip transmission line.

3. The circuit defined in claim 2 wherein the strip transmission line and transistor are part of a hybrid circuit.

4. The circuit defined in claim 2 wherein the strip transmission line is formed on a high resistivity substrate and the transistor is formed in the substrate.